United States Patent
Lee

(10) Patent No.: US 8,975,758 B2
(45) Date of Patent: Mar. 10, 2015

(54) SEMICONDUCTOR PACKAGE HAVING INTERPOSER WITH OPENINGS CONTAINING CONDUCTIVE LAYER

(75) Inventor: Seung Hyun Lee, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 290 days.

(21) Appl. No.: 13/337,197

(22) Filed: Dec. 26, 2011

(65) Prior Publication Data

US 2013/0069226 A1    Mar. 21, 2013

(30) Foreign Application Priority Data

Sep. 20, 2011    (KR) .................. 10-2011-0094541

(51) Int. Cl.
*H01L 23/48* (2006.01)
*H01L 23/52* (2006.01)
*H01L 29/40* (2006.01)
*H01L 23/02* (2006.01)
*H01L 23/34* (2006.01)
*H01L 23/498* (2006.01)
*H01L 23/31* (2006.01)

(52) U.S. Cl.
CPC ....... *H01L 23/49811* (2013.01); *H01L 23/3128* (2013.01); *H01L 23/49816* (2013.01); *H01L 2224/16225* (2013.01); *H01L 2924/15311* (2013.01); *H01L 23/49827* (2013.01); *H01L 23/49866* (2013.01)
USPC ........... 257/783; 257/686; 257/723; 257/737; 257/E23.068

(58) Field of Classification Search
None
See application file for complete search history.

(56) References Cited

U.S. PATENT DOCUMENTS

| | | | |
|---|---|---|---|
| 5,770,889 A | 6/1998 | Rostoker et al. | |
| 6,252,301 B1 | 6/2001 | Gilleo et al. | |
| 7,504,284 B2 * | 3/2009 | Ye et al. ..................... | 438/109 |
| 8,558,374 B2 * | 10/2013 | Markovich et al. .......... | 257/714 |
| 2003/0164551 A1 * | 9/2003 | Lee et al. ..................... | 257/778 |
| 2007/0075413 A1 * | 4/2007 | Egawa ......................... | 257/686 |
| 2009/0152708 A1 * | 6/2009 | Lee et al. ..................... | 257/690 |
| 2009/0279275 A1 * | 11/2009 | Ayotte et al. ................ | 361/808 |
| 2010/0044845 A1 * | 2/2010 | Funaya et al. ............... | 257/685 |
| 2010/0294552 A1 * | 11/2010 | Kobayashi et al. .......... | 174/260 |

OTHER PUBLICATIONS

Definition of simultaneously. (n.d.) The American Heritage® Dictionary of the English Language, Fourth Edition. (2003). Retrieved Mar. 24, 2014 from http://www.thefreedictionary.com/simultaneously.*

* cited by examiner

*Primary Examiner* — Michael Jung
(74) *Attorney, Agent, or Firm* — William Park & Associates Patent Ltd.

(57) ABSTRACT

A semiconductor package includes a first structural body having a first surface and a second surface which faces away from the first surface, and formed with first connection members on the first surface; a second structural body placed over the first structural body, and formed with second connection members on a surface thereof which faces the first surface of the first structural body; and an interposer interposed between the first structural body and the second structural body, and having a body which is formed with openings into which the first connection members and the second connection members are inserted and a conductive layer which is formed to fill the openings.

14 Claims, 4 Drawing Sheets

SEMICONDUCTOR PACKAGE HAVING INTERPOSER WITH OPENINGS CONTAINING CONDUCTIVE LAYER

CROSS-REFERENCE TO RELATED APPLICATIONS

The present application claims priority to Korean patent application number 10-2011-0094541 filed on Sep. 20, 2011, which is incorporated herein by reference in its entirety.

BACKGROUND OF THE INVENTION

The present invention relates generally to a semiconductor package, and more particularly to a semiconductor package having an interposer.

In general, a semiconductor package includes a substrate and a semiconductor chip mounted on the substrate. In order to electrically connect the semiconductor chip with the substrate, a wire bonding method or a bump forming method is being used.

In the case of the wire bonding method, a semiconductor chip is attached to a substrate by the medium of an adhesive, and the bonding pads of the semiconductor chip and the bond fingers of the substrate are connected with each other by metal wires through a wire bonding process such that the substrate and the semiconductor chip are electrically connected with each other. However, in this case, since exchange of electrical signals between the semiconductor chip and the substrate is implemented through the metal wires, the operating speed of the semiconductor package may become slow, and since a number of wires are used, the electrical characteristics of the semiconductor chip may deteriorate.

In the case of the bump forming method, a semiconductor chip is flip-chip bonded to a substrate by the medium of metal bumps such that the substrate and the semiconductor chip are electrically connected with each other by the bumps. Then, an underfill process for filling the space between the semiconductor chip and the substrate is performed.

With increasing demand for large-capacity, miniaturized and reliable semiconductor product, various packaging technologies for semiconductor devices are being developed. For example, packaging technologies to achieve chip size packaging and to increase mechanical and electrical reliability after mounting are being developed.

As one of these technologies, a technology increasing a number of electrode pads arranged in a limited space has been suggested so as to achieve a fine pitch during flip-chip bonding process. However, in this case, the bumps may be short-circuited, e.g., with adjacent bumps, and the electrical connection between the substrate and the semiconductor chip may become unstable.

Further, in order to prevent the bumps from being short-circuited and decrease the entire height of a package, a method for decreasing the height between the substrate and the semiconductor chip has been proposed. Nevertheless, in the case, when performing an underfill process to fill the space between the substrate and the semiconductor chip, voids may be created.

Therefore, a method for stabilizing the electrical connection between a substrate and a semiconductor chip and improving the reliability of a package is demanded.

BRIEF SUMMARY OF THE INVENTION

Embodiments of the present invention are directed to a semiconductor device which can stabilize electrical connection between a semiconductor chip and a substrate placed up and down and flip-chip bonded with each other.

Also, an embodiment of the present invention is directed to a semiconductor device which can improve the reliability of a package.

In one embodiment of the present invention, a semiconductor device includes: a first structural body having a first surface and a second surface which faces away from the first surface, and formed with first connection members on the first surface; a second structural body placed over the first structural body, and formed with second connection members on a surface thereof which faces the first surface of the first structural body; and an interposer interposed between the first structural body and the second structural body, and having a body which is defined with openings into which the first connection members and the second connection members are inserted and a conductive layer which is formed to fill the openings.

Each of the first structural body and the second structural body may include a semiconductor device or a printed circuit board.

The semiconductor device may include any one of an image sensor, a memory semiconductor, a system semiconductor, a passive device, an active device and a sensor semiconductor, and the printed circuit board may include any one of a module substrate, a package substrate, a flexible substrate and a main board.

The first structural body may have first electrode pads on the first surface, and the first connection members may be formed on the first electrode pads.

The second structural body may have second electrode pads on the surface thereof which faces the first surface of the first structural body, and the second connection members may be formed on the second electrode pads.

The first and second connection members may include any ones of bumps and conductive posts.

The first and second connection members may be formed to have the sectional shape of a triangle, an inverted triangle and a quadrangle.

The semiconductor device may further include adhesives respectively formed between the first structural body and the interposer and between the second structural body and the interposer.

A body of the interposer may be formed of any one of a dielectric substance, a thermoplastic substance, an epoxy substance, a resin substance and a photoresist substance.

The conductive layer of the interposer may be formed of a substance which has a relatively smaller strength than the first and second connection members. For example, the conductive layer of the interposer may be formed of any one of Sn, an Sn—Ag ally, an Sn—Bi alloy and an Sn—In alloy, and the first and second connection members may be formed of any one of Cu, Ni and Au.

The first and second connection members may have a width smaller than a width of each of the openings defined in the body of the interposer.

The semiconductor device may further include: an encapsulation member formed to seal the first surface of the first structural body; and external connection terminals formed on the second surface of the first structural body.

DESCRIPTION OF SPECIFIC EMBODIMENTS

In an embodiment of the present invention, an interposer, which has openings and a metal layer formed to fill the openings, is interposed between a substrate and a semiconductor chip, whereby it is possible to stabilize the electrical connection between the substrate and the semiconductor chip.

That is, in an embodiment of the present invention, the metal layer is filled in the openings of the interposer, and connection members for electrically connecting the substrate and the semiconductor chip are inserted into the openings which are filled with the metal layer, whereby the electrical connection between the substrate and the semiconductor chip may be stabilized in the openings. As a consequence, the reliability of a package may be improved.

Also, in an embodiment of the present invention, since the body of the interposer is made of a dielectric substance, an underfill process for filling the space between the semiconductor chip and the substrate, which are flip-chip bonded with each other, may be omitted. As a consequence, it is possible to manufacture a package while preventing the creation of a void in the underfill process.

Hereafter, various embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
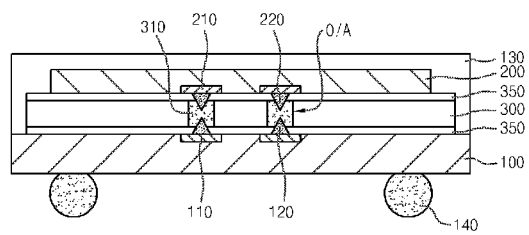
FIG. 1 is a cross-sectional view illustrating a semiconductor device in accordance with an embodiment of the present invention.

FIG. 1 is a cross-sectional view illustrating a semiconductor device in accordance with an embodiment of the present invention.

Referring to FIG. 1, a first structural body 100 has a first surface and a second surface which faces away from the first surface. A second structural body 200 is placed over the first surface of the first structural body 100 with an interposer 300 interposed therebetween.

The first structural body 100 may be, for example, any one selected from a semiconductor device such as an image sensor, a memory semiconductor, a system semiconductor, a passive device, an active device and a sensor semiconductor, and a printed circuit board such as a module substrate, a package substrate, a flexible substrate and a main board. The second structural body 200 may be, for example, any one selected from a semiconductor chip and a semiconductor package.

Hereinbelow, it will be exemplified that the first structural body 100 is a printed circuit board and the second structural body 200 is a semiconductor chip.

The first structural body 100 has the first surface and the second surface which faces away from the first surface. The first structural body 100 has first electrode pads 110 on the first surface, and first connection members 120 are formed on the first electrode pads 110. The first connection members 120 are formed as any ones of bumps or conductive posts. The first connection members 120 may be formed to have pointed ends, for example, the sectional shape of a triangle, so that the first connection members 120 can be easily inserted into openings O/A of the interposer 300.

The second structural body 200 is placed over the first surface of the first structural body 100, and has second electrode pads 210 on the surface thereof which faces the first surface of the first structural body 100. Second connection members 220 are formed on the second electrode pads 210. The second connection members 220 are formed as any ones of bumps or conductive posts. The second connection members 220 may be formed to have pointed ends, for example, the sectional shape of an inverted triangle, such that the second connection members 220 can be easily inserted into the openings O/A of the interposer 300.

The interposer 300 is interposed between the first structural body 100 and the second structural body 200. Adhesives 350 are respectively formed between the first structural body 100 and the interposer 300 and between the second structural body 200 and the interposer 300. The body of the interposer 300 is formed to have the openings O/A into which the first connection members 120 and the second connection members 220 are inserted. A conductive layer, for example, a metal layer 310 is formed to fill the openings O/A.

The body of the interposer 300 is formed of any one of, for example, a dielectric substance, a thermoplastic substance, an epoxy substance, a resin substance and a photoresist substance. The openings O/A formed through the body of the interposer 300 are located at positions corresponding to the first and second connection members 120 and 220 of the first and second structural bodies 100 and 200. Each of the first and second connection members 120 and 220 has a width smaller than the width of each of the openings O/A to be inserted into the opening O/A formed in the body of the interposer 300.

The metal layer 310 of the interposer 300 is formed of a substance which has a relatively smaller strength than the first and second connection members 120 and 220 so that the first and second connection member 120 and 220 can be easily inserted into the openings O/A. For example, the first and second connection members 120 and 220 are formed of any one of Cu, Ni and Au, and the metal layer 310 of the interposer 300 is formed of any one of an Sn—Ag alloy, an Sn—Bi alloy and an Sn—In alloy which are relatively softer than the first and second connection members 120 and 220.

An encapsulation component 130 is formed to seal the first surface of the first structural body 100 on which the interposer 300 and the second structural body 200 are placed, and external connection terminals 140 are formed on the second surface of the first structural body 100 which faces away from the first surface.

According to an embodiment of the present invention, the second structural body 200 is flip-chip bonded to the first structural body 100, and the interposer 300 having the openings O/A is interposed between the first structural body 100 and the second structural body 200. The openings O/A of the interposer 300 is filled with the metal layer 310, and the first and second connection members 120 and 220 of the first and second structural bodies 100 and 200 are inserted into the openings O/A of the interposer 300 which are filled with the metal layer 310.

As a consequence, the first connection member 120 of the first structural body 100 and the second connection members 220 of the second structural body 200 may be electrically connected with each other in the openings O/A of the interposer 300 by the metal layer 310 formed to fill the openings O/A.

Therefore, even though a semiconductor package has a fine pitch, since the electrical connection between the first and second connection members 120 and 220 is implemented in the openings O/A of the interposer 300, the electrical connection between the first and second connection members 120 and 220 may be stably implemented and through this, the reliability of a package may be improved.

Also, in an embodiment of the present invention, because the body of the interposer 300 interposed between the first structural body 100 and the second structural body 200 is formed of a dielectric substance, an underfill process for filling the space between the first structural body 100 and the second structural body 200 may be omitted, whereby the creation of a void in the underfill process may be suppressed and the manufacturing cost of a package may be reduced. In particular, as the underfill process may be omitted in the manufacture of a package, the height between the first structural body 100 and the second structural body 200 may decrease, whereby the size of the entire package may decrease.

FIGS. 2A to 2E are cross-sectional views explaining the processes of a method for manufacturing the semiconductor device in accordance with an embodiment of the present invention.

Figure 2A:
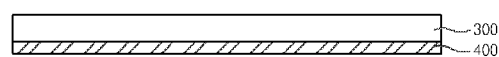
FIGS. 2A to 2E are cross-sectional views explaining the processes of a method for manufacturing the semiconductor device in accordance with an embodiment of the present invention.

Referring to FIG. 2A, the body of an interposer 300 is formed on a base substrate 400. The base substrate 400 includes a substrate made of a conductive substance, for example, a copper-plated substrate, and the body of the interposer 300 includes any one of a dielectric substance, a thermoplastic substance, an epoxy substance, a resin substance and a photoresist substance.

Figure 2B:
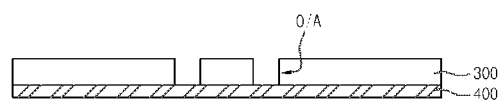

Referring to FIG. 2B, by etching the body of the interposer 300, openings O/A are formed. The openings O/A are formed to a depth capable of exposing portions of the underlying base substrate 400, and are located at positions corresponding to electrodes pads of structural bodies between which the interposer 300 is to be interposed.

Figure 2C:
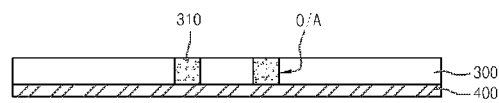

Referring to FIG. 2C, a conductive layer, for example, a metal layer 310 is formed to fill the openings O/A. The metal layer 310 may be formed through electroplating. The metal layer 310 is formed of a metal which is relatively softer than the connection members of the structural bodies between which the interposer 300 is to be interposed, for example, any one of an Sn—Ag alloy, an Sn—Bi alloy and an Sn—In alloy. After the metal layer 310 is formed, the portion of the metal layer 310, which is formed on the body of the interposer 300, may be removed through performing a CMP (chemical mechanical polishing) process.

Figure 2D:
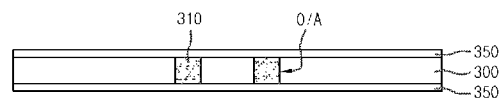

Referring to FIG. 2D, after removing the base substrate 400 from the body of the interposer 300 which is formed with the metal layer 310, adhesives 350 are respectively formed on the upper surface and the lower surface of the body of the interposer 300. In the case where the body of the interposer 300 is formed of a substance with an adhesion property, the adhesives 350 may not be formed.

Figure 2E:
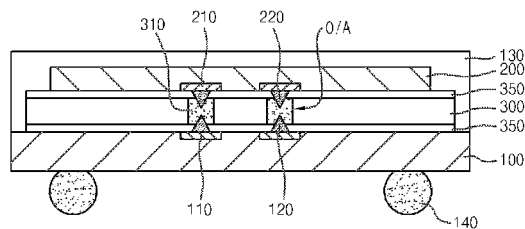

Referring to FIG. 2E, the interposer 300 formed with the adhesives 350 is interposed between a first structural body 100 and a second structural body 200. At this time, first connection members 120 which are formed on first electrode pads 110 of the first structural body 100 and second connection members 220 which are formed on second electrode pads 210 of the second structural body 200 are inserted into the openings O/A of the interposer 300. By applying heat and pressure, for example, by applying heat of 200~250° C. and pressure of 20~100 MPa, the first structural body 100 and the second structural body 200 are flip-chip bonded with each other with the interposer 300 interposed therebetween.

Since the metal layer 310 which is formed of a substance relatively softer than the first and second connection members 120 and 220 is filled in the openings O/A of the interposer 300, the first and second connection members 120 and 220 may be inserted into the metal layer 310 of the interposer 300. Further, since the metal layer 310 is fixed with respect to the body of the interposer 300, when performing flip-chip bonding in which the first and second connection members 120 and 220 are inserted into the metal layer 310, the metal layer 310 may not overflow out of the openings O/A of the body of the interposer 300.

Because the interposer 300 made of a dielectric substance is interposed between the first structural body 100 and the second structural body 200 which are flip-chip bonded with each other, it is not necessary to perform an underfill process to fill the space between the first structural body 100 and the second structural body 200 after the flip-chip bonding.

An encapsulation component 130 is formed on the first surface of the first structural body 100 which is flip-chip bonded with the second structural body 200, to seal the first surface, and external connection terminals 140 are formed on the second surface of the first structural body 100.

In an embodiment of the present invention, due to the fact that the second structural body 200 is flip-chip bonded to the first structural body 100, and the interposer 300 with the openings O/A in which the metal layer 310 is filled is interposed between the first structural body 100 and the second structural body 200, electrical connection between the first structural body 100 and the second structural body 200 may be implemented by the metal layer 310 filled in the openings O/A of the interposer 300.

In an embodiment of the present invention, since the metal layer 310 of the interposer 300 is formed of a substance which is relatively softer than the first and second connection members 120 and 220 of the first and second structural bodies 100 and 200, the first and second connection members 120 and 220 may be inserted into the metal layer 310 of the interposer 300, as a result of which electrical connection between the first and second structural bodies 100 and 200 may be stably implemented by the metal layer 310 filled in the openings O/A of the interposer 300. Accordingly, even though the first and second electrode pads 110 and 210 of the first and second structural bodies 100 and 200 are formed to have a fine pitch, since the electrical connection between the first and second structural bodies 100 and 200 is stably implemented, the reliability of a package may be improved.

In addition, in an embodiment of the present invention, since the body of the interposer 300 is made of a dielectric substance, an underfill process for filling the space between the first structural body 100 and the second structural body 200 may be omitted. As a consequence, in the embodiment of the present invention, since it is possible to prevent the creation of a void in the underfill process, the interval between the first structural body 100 and the second structural body 200 may decrease, whereby the entire height of a package may decrease.

While it was illustrated and explained in the embodiment of the present invention that the first and second connection members of the first and second structural bodies are formed to have the sectional shapes of a triangle and an inverted triangle so as to be easily inserted into the openings of the interposer, the present invention is not limited to such. In an embodiment of the present invention, the first and second connection members of the first and second structural bodies may be formed to have the sectional shape of a quadrangle.

Figure 3:
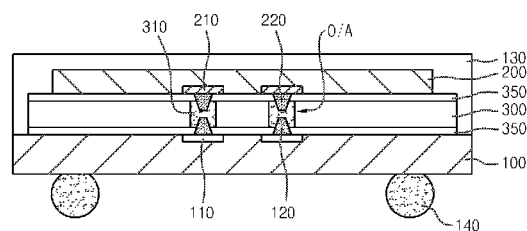
FIG. 3 is a cross-sectional view illustrating a semiconductor device in accordance with an embodiment of the present invention.

FIG. 3 is a cross-sectional view illustrating a semiconductor device in accordance with an embodiment of the present invention.

Referring to FIG. 3, an interposer 300 is interposed between a first structural body 100 and a second structural body 200. First connection members 120 are formed on first electrode pads 110 of the first structural body 100, and second connection members 220 are formed on second electrode pads 210 of the second structural body 200. The first and second connection members 120 and 220 have, for example, the sectional shape of a quadrangle.

The first and second connection members 120 and 220 are inserted into openings O/A of the interposer 300. Since a metal layer 310 which is formed of a substance relatively softer than the first and second connection members 120 and 220 is filled in the openings O/A of the interposer 300, the first and second connection members 120 and 220 may be inserted into the metal layer 310 filled in the openings O/A. In order to ensure that the first and second connection members 120 and 220 are easily inserted into the metal layer 310 filled in the openings O/A, the first and second connection members 120 and 220 may have the sectional shape of a quadrangle which is narrower at one end than at the other end.

While it was illustrated and explained in the embodiments of the present invention that the interposer is applied to the electrical connection between the printed circuit board as the first structural body and the semiconductor chip as the second structural body, the present invention is not limited to such. It is conceivable that the interposer may be applied to the electrical connection between a semiconductor chip and a semiconductor chip or the electrical connection between a package and a package.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a first structural body having a first surface and a second surface which faces away from the first surface, and formed with first connection members on the first surface;
   a second structural body placed over the first structural body, and formed with second connection members on a surface which faces the first surface of the first structural body;
   an interposer interposed between the first structural body and the second structural body, and having a body which is formed with a plurality of openings into which one of the first connection members is inserted into a single opening and one of the second connection members is inserted into the single opening among the plurality of openings and a conductive layer which is formed to fill the plurality of openings;
   an encapsulation member formed to seal the first surface of the first structural body; and
   external connection terminals formed on the second surface of the first structural body.

2. The semiconductor package according to claim 1, wherein each of the first structural body and the second structural body comprises a semiconductor device or a printed circuit board.

3. The semiconductor device according to claim 2, wherein the semiconductor device comprises any one of an image sensor, a memory semiconductor, a system semiconductor, a passive device, an active device and a sensor semiconductor.

4. The semiconductor package according to claim 2, wherein the printed circuit board comprises any one of a module substrate, a package substrate, a flexible substrate and a main board.

5. The semiconductor package according to claim 1,
   wherein the first structural body has first electrode pads on the first surface, and
   wherein the first connection members are formed on the first electrode pads.

6. The semiconductor package according to claim 1,
   wherein the second structural body has second electrode pads on the surface which faces the first surface of the first structural body, and
   wherein the second connection members are formed on the second electrode pads.

7. The semiconductor package according to claim 1, wherein the first and second connection members comprise any ones of bumps and conductive posts.

8. The semiconductor package according to claim 1, wherein the first and second connection members have the sectional shape of any ones of a triangle, an inverted triangle and a quadrangle.

9. The semiconductor package according to claim 1, further comprising:
   adhesives respectively formed between the first structural body and the interposer and between the second structural body and the interposer.

10. The semiconductor package according to claim 1, wherein the body of the interposer is formed of any one of a dielectric substance, a thermoplastic substance, an epoxy substance, a resin substance and a photoresist substance.

11. The semiconductor package according to claim 1, wherein the conductive layer of the interposer is formed of a substance which has a relatively smaller strength than the first and second connection members.

12. The semiconductor package according to claim 11, wherein the conductive layer of the interposer is formed of any one of Sn, an Sn—Ag alloy, an Sn—Bi alloy and an Sn—In alloy.

13. The semiconductor package according to claim 11, wherein the first and second connection members are formed of any one of Cu, Ni and Au.

14. The semiconductor package according to claim 1, wherein the first and second connection members have a width smaller than a width of each of the openings formed in the body of the interposer.

* * * * *